United States Patent
Windl

(10) Patent No.: US 11,867,777 B2
(45) Date of Patent: Jan. 9, 2024

(54) MEASUREMENT OF POSITIONS, MECHANICAL DISPLACEMENTS AND ROTATIONS AND STRESSES OF BODIES

(71) Applicant: Roman Windl, Traismauer-Wagram (AT)

(72) Inventor: Roman Windl, Traismauer-Wagram (AT)

( * ) Notice: Subject to any disclaimer, the term of this patent is extended or adjusted under 35 U.S.C. 154(b) by 237 days.

(21) Appl. No.: 16/999,124

(22) Filed: Aug. 21, 2020

(65) Prior Publication Data

US 2021/0055359 A1    Feb. 25, 2021

(30) Foreign Application Priority Data

Aug. 21, 2019 (AT) .................... A 276/2019

(51) Int. Cl.
  *G01R 33/02*   (2006.01)
  *G01R 33/00*   (2006.01)

(52) U.S. Cl.
  CPC ......... *G01R 33/02* (2013.01); *G01R 33/0094* (2013.01)

(58) Field of Classification Search
  CPC ..... G01R 33/02; G01R 33/0094; G01D 5/165
  See application file for complete search history.

(56) References Cited

U.S. PATENT DOCUMENTS

| | | | | |
|---|---|---|---|---|
| 6,136,166 A | * | 10/2000 | Shen | H01J 37/3266 118/500 |
| 2014/0167745 A1 | * | 6/2014 | Held | G01B 7/004 73/1.79 |
| 2016/0084656 A1 | * | 3/2016 | Villien | G01P 13/00 701/519 |
| 2016/0371316 A1 | * | 12/2016 | Okanohara | G06N 3/0445 |
| 2017/0227995 A1 | * | 8/2017 | Lee | G06N 20/00 |

* cited by examiner

*Primary Examiner* — Alvaro E Fortich
(74) *Attorney, Agent, or Firm* — Panitch Schwarze Belisario & Nadel LLP

(57) ABSTRACT

The invention concerns a device and a method for measuring the relative position and angles between two bodies to be measured (7, 77). The invention is characterized in that it comprises one or more permanent magnets (6) and in that the position to be measured is determined indirectly via a magnetic field. The magnetic field is detected by one or more magnetic field sensors (3) read by a microchip. A mathematical minimization method is used to calculate back to the position and angles of the permanent magnet system (6) in relation to the magnetic field sensors (3). The energy required to read out the sensors can be obtained from the excitation field of a readout device. The sensor can perform without energy supply and can be read out by means of standard readout devices, such as an NFC-capable mobile telephone.

15 Claims, 20 Drawing Sheets

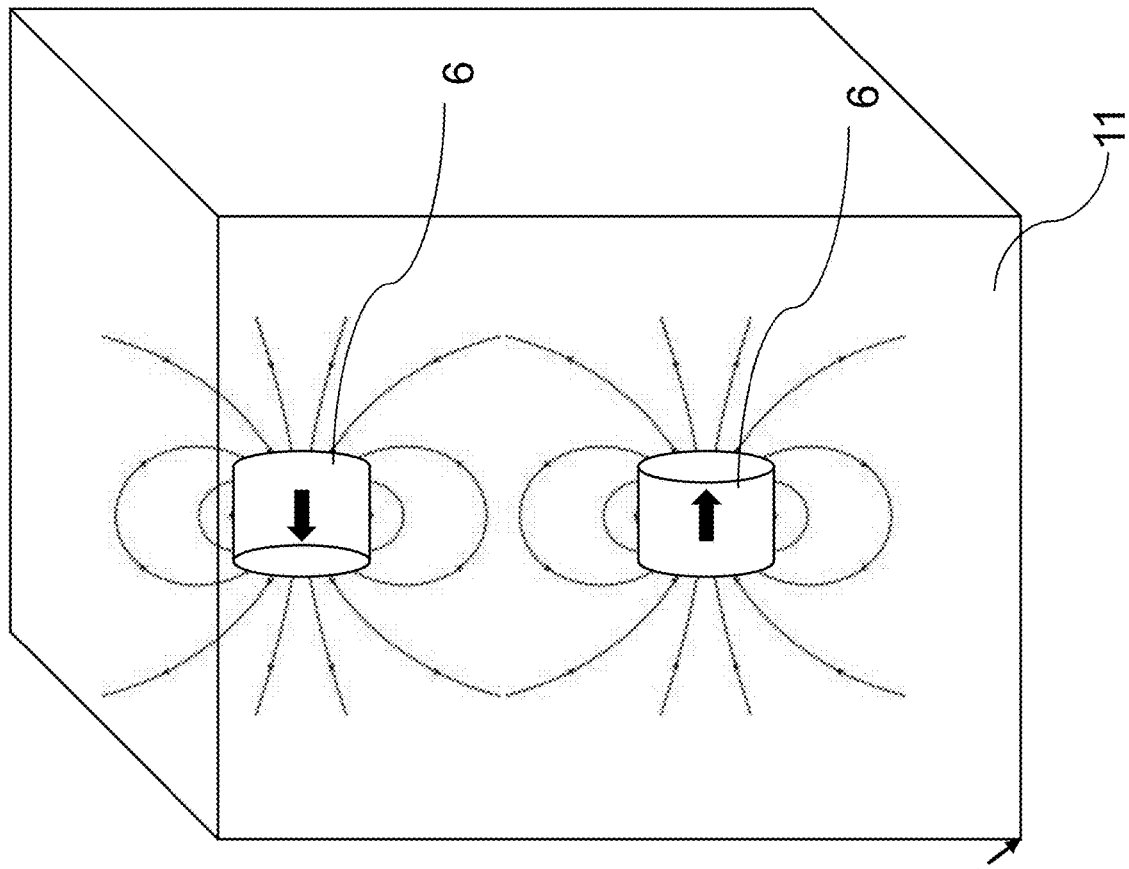
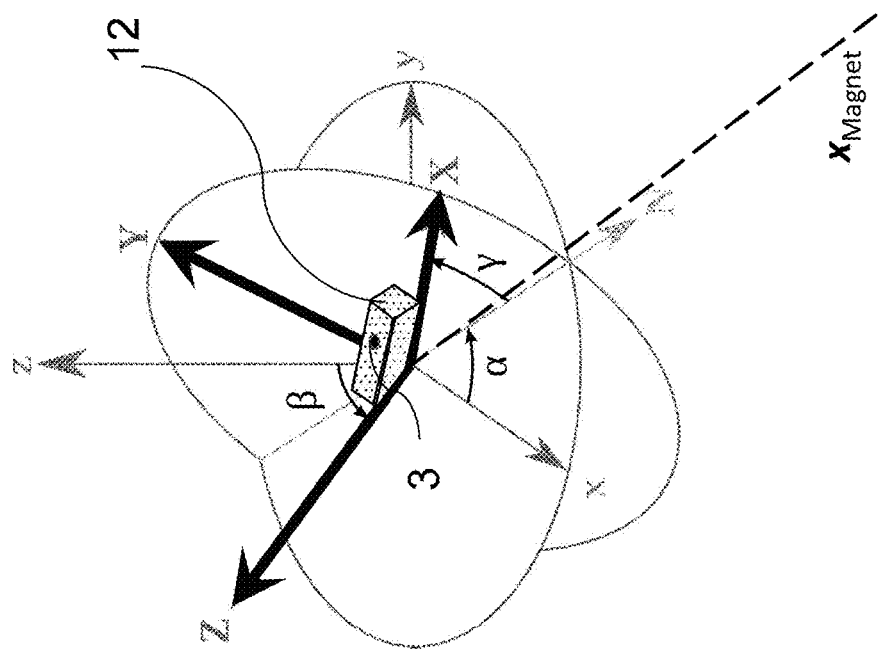
Fig. 2

MEASUREMENT OF POSITIONS, MECHANICAL DISPLACEMENTS AND ROTATIONS AND STRESSES OF BODIES

BACKGROUND

Field of Invention

The invention relates to the measurement of positions in space, mechanical displacements and rotations, stresses, strains and pressures and in particular a method corresponding to the introductory part of claim 1 and a device corresponding to the introductory part of claim 7 suitable therefor.

Description of Related Art

Various technical implementations are state of the art for linear position sensors (displacement sensors). Potentiometers and strain gauges are based on resistance change. A change in position leads to a change in the inductance of inductive sensors. Such a sensor is known from the SE 9 501 500 A for measuring a force acting on a plate. The plate presses on the core of an electric coil, which has a magnetorestrictive material or at least partly consists of it. Due to the change in geometry as a result of the force, the magnetic properties of the core change, which is measured via the coil and evaluation electronics. This allows conclusions to be drawn about the force.

Other sensors with magnetorestrictive material are known from WO 2004/070408 A, JP 2005338031 A, JP 8293012 A and US 2002166382 A.

Other designs for displacement sensors are capacitive sensors in which a change in position of the capacitor plates or the dielectric leads to a change in capacitance.

Furthermore, a distance can be determined by means of transit time measurement, as for example with laser rangefinders or ultrasonic sensors. In magnetostrictive displacement transducers, the distance of an adjacent magnet is determined by measuring the travel time of a torsional wave in a tube. In applications for "Structural Health Monitoring", vibrating side sensors are often used.

Another class of displacement sensors is based on incremental encoders. Here, periodic measuring standards (for optical systems lines on glass or metal, for magnetic systems magnetization on a magnetic tape) are counted by electronics. The disadvantage of these systems is that no absolute measurement of the position is possible.

To be able to determine absolute positions in one direction (one dimension), the current position is encoded by a magnetic bit pattern. This can be achieved, for example, by using a second track or by the phase relationship between the tracks (DE10038296A1, US20180306601A1). Magnetic sensors are used to read out this bit pattern. In order to determine the absolute position, more than one field component must be read out and thus more than one magnetic field sensor must be used.

Another possibility is to infer the position relative to a magnetic field sensor from the magnetic field of a permanent magnet. From generally two components of the magnetic field (Ortner, M., et al. "Application of 3D-printed magnets for magnetic position detection systems. 2017 IEEE SENSORS. IEEE, 2017) can be used to infer the position of a direction.

All of the methods described above have in common that they can only determine the position in one direction (dimension).

However, for a large number of applications the 3D determination of the position is important. Examples are the position of a joystick, the movement of components in relation to each other (crack monitors), the exact position of robot arms and machine parts.

DETAILED DESCRIPTION OF THE INVENTION

The invention is designed to solve this problem and proposes to detect absolute mechanical positions, displacements and rotations between two spatially and mechanically separated objects. In a variant of the application, this determination can also be passive, i.e. the inventive sensor does not require a battery. In this case, the sensor is designed to function as a passive element that requires neither its own power supply nor other electronic elements. This system can be read with standard readers, such as a commercial mobile phone with NFC functionality.

In the invention, the spatial position of a permanent magnet system (6) is calculated back to the spatial position of the system on the basis of the measured magnetic fields, where the magnetic fields being detected by magnetic field sensors. This enables an absolute detection of the position in 6 dimensions, namely 3 positions (x,y,z) and 3 rotation angles (for example 3 Euler angles or quaternions). Absolute in this context means that the zero point of the position is always known, this is an advantage compared to relative measuring methods, which have to move to a reference point to determine the zero point in case of power loss or measuring errors.

An arrangement of the invention may contain the following essential elements of the system:

(i) A micro-chip (4) which provides analogue or digital evaluation of various magnetic field sensors (3), stores the ID of the sensor and has wireless readout units such as Bluetooth or RFID.

(ii) One or more magnetic field sensors (3) which measure at least one component of the magnetic field but preferably all three components of the magnetic field. Other sensors such as temperature sensors can be used to increase the accuracy of the measurement by performing temperature compensation.

(iii) At least one permanent magnet (6) which is known in shape and magnetization and from which the position is determined absolutely to the magnetic field sensors.

(iv) Optionally the sensor can be equipped with a battery (10) so that measurement data can be recorded independently of the read signal.

By means of the radio signal of the interrogator, a passive RFID transponder can obtain enough energy to read a magnetic field sensor (3). Standard sensors such as Hall, AMR, GMR, TMR or flux gate sensors can be used as magnetic field sensors.

The magnetic stray field $H_{measurement}$ of the permanent magnet system (6) is measured in advance or simulated by mathematical methods. The magnetic field sensors are arranged so that a desired displacement range can be measured with a desired resolution. By increasing the number of magnetic field sensors (3) the displacement range can be increased or the position accuracy improved. Reducing the number of magnetic field sensors reduces the displacement range or worsens the position accuracy.

As an example, FIG. 2 shows the angles of the housing (12) of the magnetic field sensors (3) and the holder (housing) (11) of the permanent magnets (6). The distance between the housing (12) and the housing of the permanent magnets (11) is the magnitude of the vector xmagnet. The angular position in the space of object 3 is represented by the Euler angles $(\alpha,\beta,\gamma)$ shown.

Of course, the housing (12) of the magnetic field sensors can also be defined as a fixed coordinate system and the angular position of the housing (11), i.e. of the magnet system, can be described by Euler angles $(\alpha,\beta,\gamma)$. The vector $x_{magnet}$ describes the relative local displacement of these two housings.

From the measured magnetic field and the known arrangement of the sensors one can calculate back to the position of the permanent magnet system (6) in relation to the magnetic field sensors.

A characteristic is described in detail in the following. The permanent magnets (6) generate a magnetic field $H_{measurement,i}$ at the position of the field sensor i. On the other hand, with known geometry, arrangement of the magnets to each other, given magnetization M or magnetization direction of the permanent magnets, for a certain position of the magnet system $x_{magnet}$ and a certain rotational orientation in space, which is defined by the Euler angles $(\alpha,\beta,\gamma)$ for example, the expected magnetic field $H_{theory,i}(x_{magnet})$ at the locations $x_i$ can be determined. From the measured magnetic field and the expected magnetic field, if the permanent magnet system (6) is aligned at the location $x_{magnet}$ and the rotation in space is given by the Euler angles $(\alpha,\beta,\gamma)$ a mathematical norm (distance d) between these two fields is determined $$d(x_{magnet}, \alpha, \beta, \gamma) = \sum_{i=1}^{N} \|H_{theory,i}(x_{magnet}, \alpha, \beta, \gamma) - H_{measurement,i}\|, \quad (1.1)$$

where N is the number of magnetic field sensors at locations $x_i$. The unknown position $x_{magnet}$ of the permanent magnet system (6) and orientation in space is determined such that the distance d is minimized. Other unknown quantities can be implemented in the distance function d, such as sensor sensitivity in the x,y and z direction, temperature-dependent magnetization and the like. As long as the measured field values of the sensors are greater than the number of unknowns, the system can be solved unambiguously.

Various norms can be used, such as the Euclidean norm, sum norm, p norm, maximum norm.

Of course, the rotation is space can not only described by Euler angles but also by quaternions or any other quantity that described the rotation position in a unique way. If only the position in space should be determined but not the rotation in space the distance function can be simplified to $$d(x_{magnet}) = \sum_{i=1}^{N} \|H_{theory,i}(x_{magnet}) - H_{measurement,i}\|, \quad (1.2)$$

In order to obtain the unknowns on the left side of Eq. 1.1 the distance d has to be minimized. To obtain the unknown components of the vector $x_{magnet}$ on the left side of Eq. (1.2), the distance d must be minimized. The position vector $x_{magnet}$ can only consist of the x component, the x and y component or the x, y and z component.

The orientation in space is generally described with a vector $y_{magnet}$ which contains both the position vector and the angular position, $y_{magnet}=x_{magnet}$. In further claims this orientation in space is generalized that further unknowns like temperature T, or sensitivity of the magnetic field sensors in all directions $(S_x,S_y,S_z)$ occur in this vector $y_{Magnet}=(x_{Magnet}, \alpha,\beta,\gamma, T, S_x, S_y, S_z)$. Here, in the calculation of H-theory, the influence of these additional quantities on the expected measured field H-theory must be known and taken into account in the calculation of H-theory. For the distance function follows:

$$d(y_{magnet}) = \sum_{i=1}^{N} \|H_{theorie,i}(y_{magnet}) - H_{measurement,i}\|. \quad (1.3)$$

The unknowns of all components of the vector $y_{magnet}$ are obtained by minimizing the distance d. It should be noted that the vector $y_{magnet}$ is further called orientation in space, although it contains not only position coordinates and rotation angles but also other quantities such as T and $S_x$ etc. Furthermore, it is possible to introduce a further unknown in the calculation of $H_{theory}$, namely that each component of the theoretical field $H_{theory}$ is scaled by a factor $\xi$. This factor describes, for example, an approximation of the temperature dependent magnetization or temperature dependent sensitivity of magnetic field sensors. This factor is a further unknown that is determined in the minimization of the distance d.

This minimization is generally done numerically and various minimization routines such as Nelder-Mead, Powell minimization, conjugated gradients, BFGS (Broyden-Fletcher-Goldfarb-Shanno) minimization. Also global minimization methods can be used like, "Basinhopping", Evolutionary Algorithms, or "Simulated Annealing".

The magnetic field of the permanent magnet system (6) can be calculated either analytically or numerically using boundary element methods or finite element methods. With numerical calculation methods, the macroscopic Maxwell equations can be solved so that self-demagnetization effects of the magnets or other soft magnetic materials can be taken into account.

In addition, "machine learning" methods can be used to predict the orientation in the space $y_{Magnet}$ for several measured values $H_{measurement}$. For this purpose, the magnetic field at the sensor positions $H_{theory,i}(y_{magnet})$ is evaluated for various known orientations in the space $y_{magnet}$. This evaluation can either be done by simulations or measurements of the real system or both approaches can be combined in a "machine learning" method, e.g. Data Fusion "machine learning". For these known fields $H_{theory,i}$ the "Machine Learning" method is trained with the also known orientations in the space $y_{magnet}$. Thus the machine learning system is able to predict the orientation of the magnet $y_{magnet}$ for the measured field $H_{measurement}$. Different "Machine Learning" methods can be used, like "Gradient Boost", neural networks, or other methods for regression and classification problems.

It is also possible to combine the methods of "Machine Learning" and the minimization of the problem according to Eq. (1.3). For example, the prediction of the "Machine Learning" method, i.e. the vector $y_{magnet}$, can be used as input for the starting position $y_{magnet,0}$ of Eq. (1.3), which is then minimized with a minimization method as described above.

Another method to determine $H_{theory,i}(x_{magnet}, \alpha,\beta,\gamma)$ is to first measure the magnetic field of the permanent magnet system and store the magnetic field values as a function of space, $H_{theory,i,0}(x_{magnet}=0, \alpha=0, \beta=0, \gamma=0)$. By using translation and rotation operations from the previously determined field $H_{Theorie,i,0}$ can calculate the unknown positions and angles and determine $H_{Theorie,i}(x_{magnet}, \alpha,\beta,\gamma)$.

This method can also be used if the permanent magnet system (6) is mounted on a soft magnetic shield (66), for example. Here, the total magnetic field of permanent magnets (6) and soft magnetic shield (66) is simulated or measured. This soft magnetic shielding can be designed as a platelet, ribbon or in any other geometric shape.

The sensors in accordance with the invention are also suitable for wireless measurements and displacement measurements and can be used in particular where cabling can only be implemented with great effort and/or with restrictions in the application.

BRIEF DESCRIPTION OF THE SEVERAL VIEWS OF THE DRAWING

The invention is explained in more detail below on the basis of the drawing. Thereby shows, or rather show, quite schematically.

DETAILED DESCRIPTION OF THE SEVERAL VIEWS OF THE DRAWING

Figure 1:
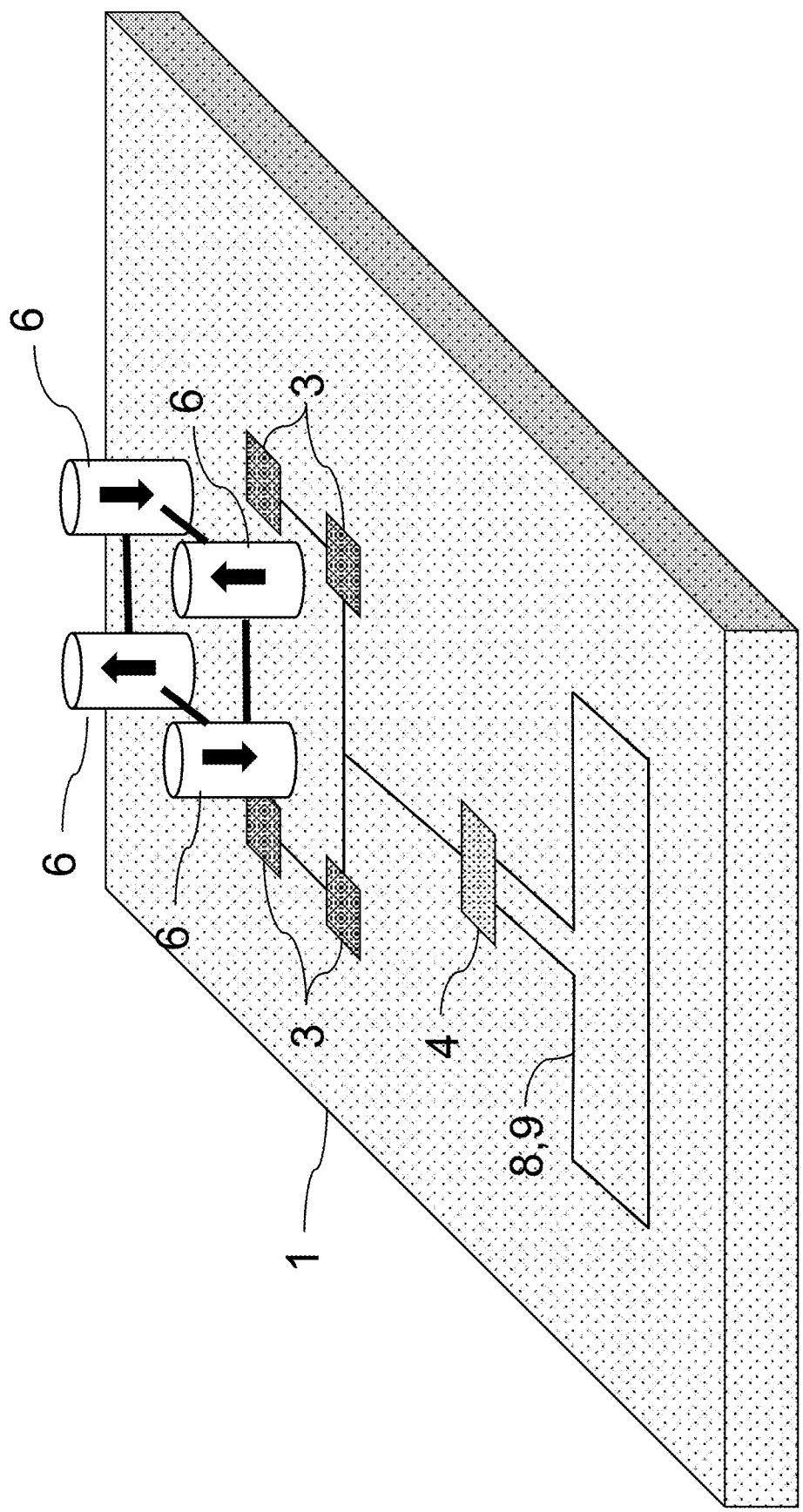
FIG. 1 a device according to the invention for measuring displacements with four magnets FIG. 2 example of the Euler angles ($\alpha,\beta,\gamma$) of the sensor system (3) and exemplary magnetic field distribution of the permanent magnets (6)

FIG. 1 shows the sensor device (1) consisting of several magnetic field sensors (3), a mico chip (4), which has an RFID transponder with an antenna (9) or a cable connection (8) and the permanent magnet (6). The permanent magnets have a fixed alignment to each other and are attached to a second body (7), whereby the relative position is determined from body (7) to body (1). The magnetic field sensors (3) measure the current magnetic field $H_{measurement,i}$ of the permanent magnet system (6) at the location of the i-th sensor $x_i$. This field is compared by the microchip (4) with the simulated or previously measured magnetic field of the permanent magnet system $H_{theory,i}$. From this a distance norm d is determined in order to be able to determine the position of the permanent magnet system (6) by minimizing the unknowns, i.e. the position and orientation in space (Euler angle). This means that the position and rotation of the permanent magnet system (6) relative to the magnetic field sensors (3) can be calculated without mechanical connection.

One or more permanent magnets (6) are mounted in a holder (11) on the body (7) to be measured. The magnetic field sensors (3) and the microchip (4) are placed together in a housing (12) and are mounted on the same body (7), or on a mechanically separated body (77).

The permanent magnets can be glued or screwed directly to a housing or integrated directly into the body to be measured.

Due to the use of several magnetic field sensors (3), external disturbing influences such as the earth's magnetic field or temperatures can be compensated. To further compensate the influence of temperature on the sensor signal, a micro-chip (4) with an internal or external temperature sensor can be used. By knowing the current temperature, the temperature-dependent measured resistance value of the magnetic field sensor can be compensated.

Figure 3:
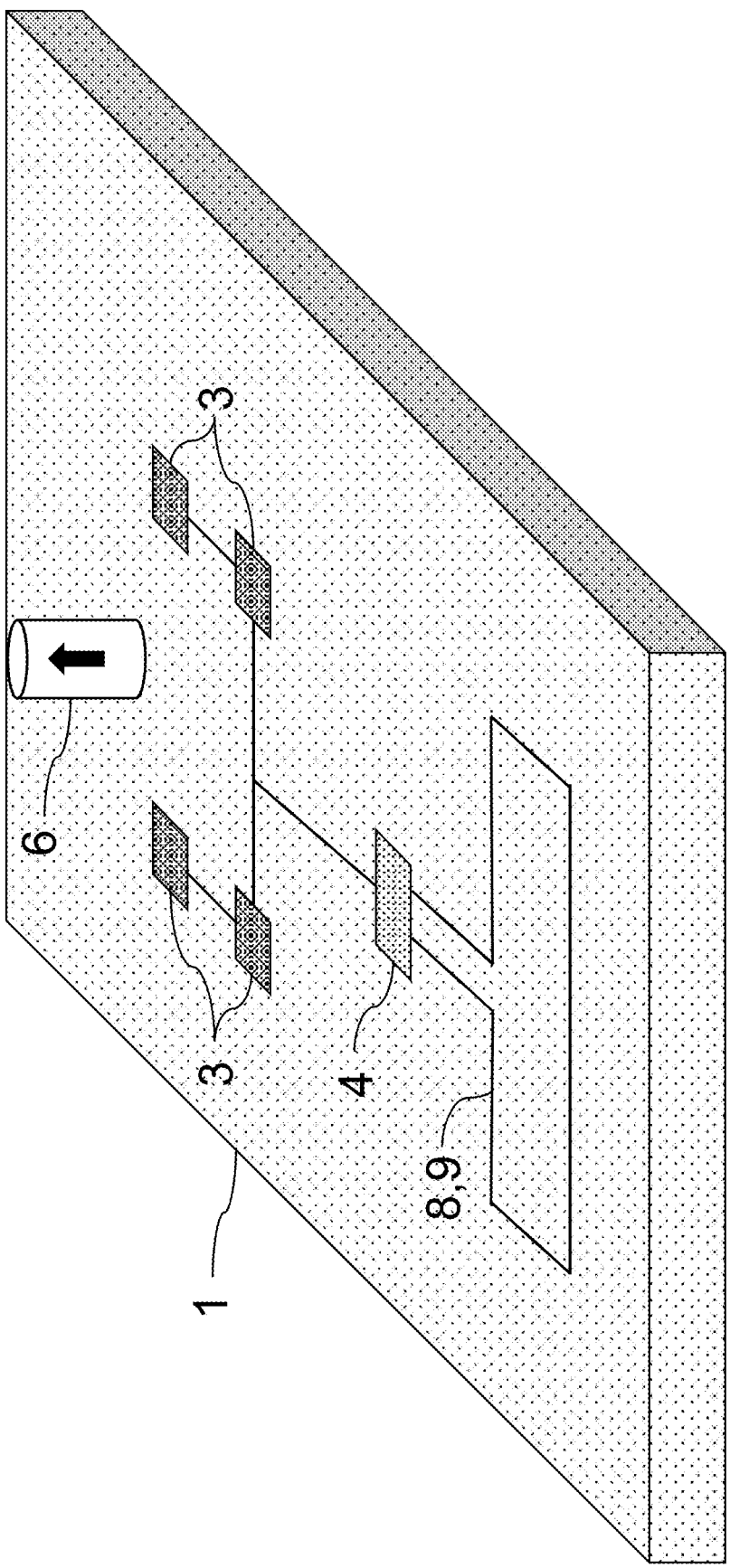
FIG. 3 a device for measuring displacements with a magnet

FIG. 3 shows a manifestation of the invention where only one permanent magnet is used to determine the position between the magnets (6) and the sensor array (3). A possible rotation of the magnet (6) around its axis of symmetry cannot be detected because the magnetic field is rotationally symmetric around this axis.

Figure 4:
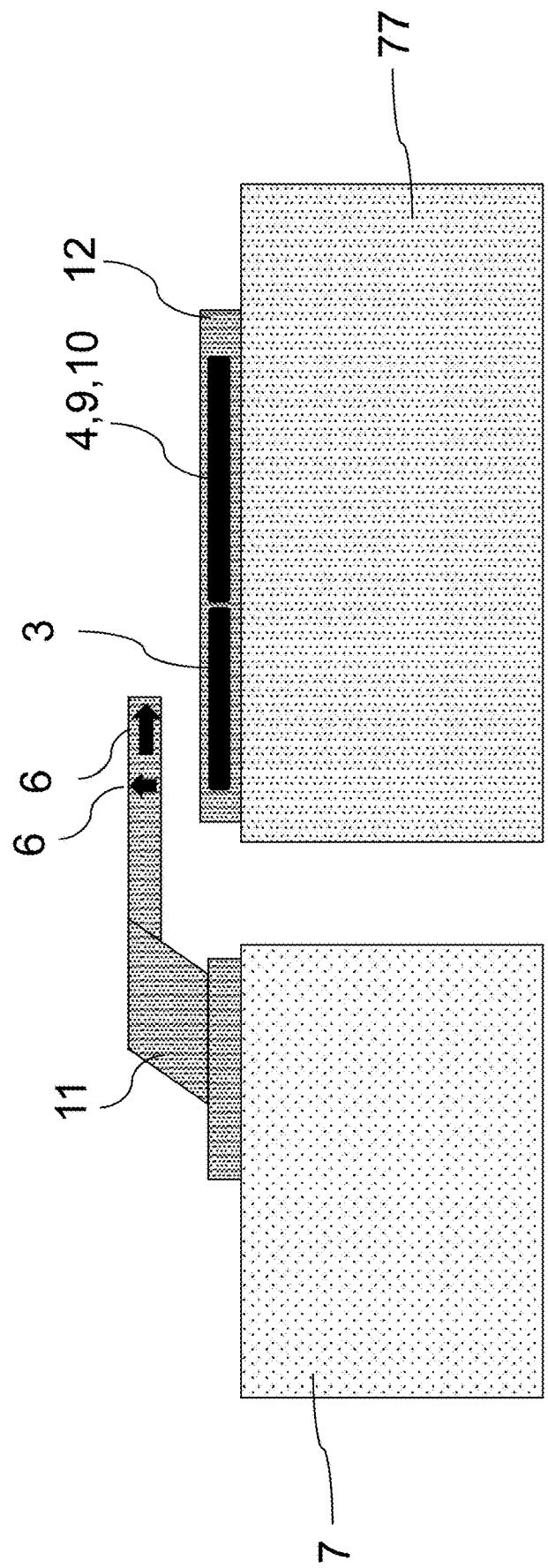
FIG. 4 a variant for measuring displacements between two bodies with a different arrangement of the magnets FIG. 5 a variant for measuring displacements between two bodies with an anti-parallel alignment of the magnetization of the magnets FIG. 6 a variant for measuring displacements between two bodies with a Halbach magnetization of the magnets FIG. 7 a variant of the permanent magnets using a pseudo random code.

FIG. 4 represents a version of the sensor described in FIG. 1 for measuring the distance and angular displacement between the reference body (77) and the body (7) to be measured. The permanent magnets (6) have a magnetization that is not parallel to each other. The permanent magnets (6) are placed above the magnetic field sensors (3) by means of a holder (11), which can assume a wide variety of geometric shapes and sizes. The magnetic field sensors (3), the microchip (4), the antenna (9) and optionally a battery (10) in a housing (12) or a protective cover (12) is shown. Displacements and rotations between the reference body (77) and the body to be measured (7) can be carried out via solving the inverse problem as described for FIG. 1.

Figure 5:
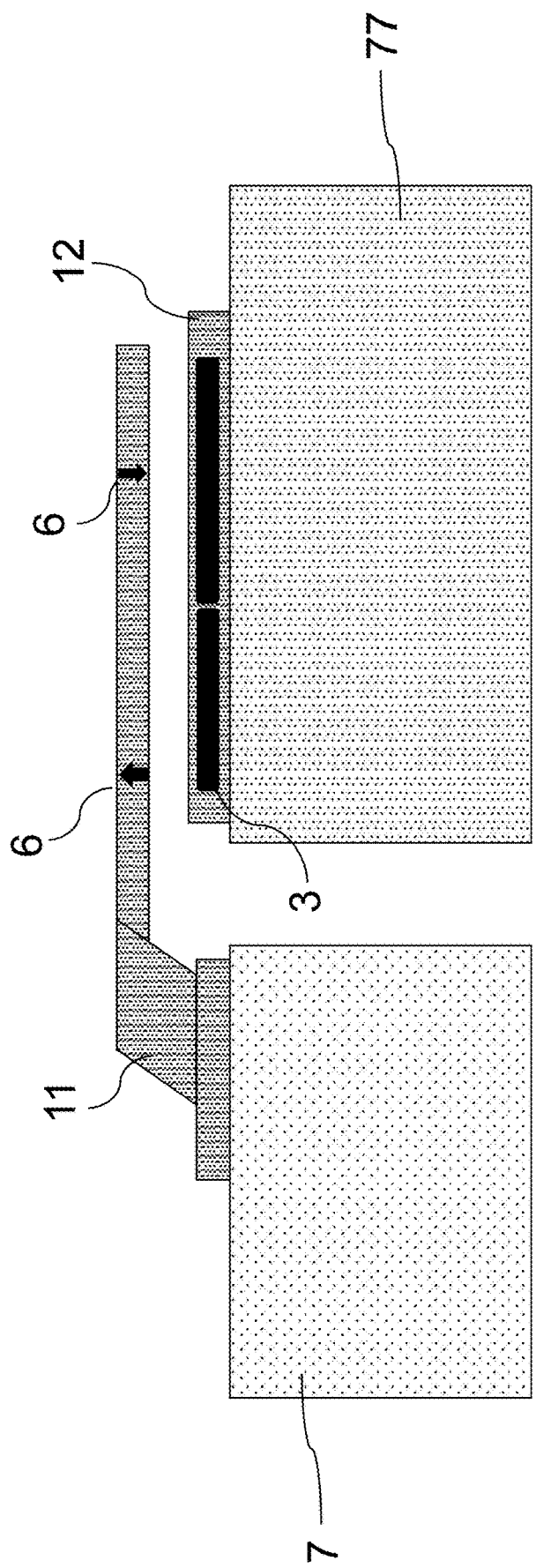

FIG. 5 shows a characteristic of the sensor described in FIG. 1. for measuring the distance and angular rotation between the reference body (77) and the body (7) to be measured, the permanent magnets having an antiparallel magnetization. Furthermore, arrangements are possible where the magnetisation of the permanent magnets is generally not colinear.

Figure 6:
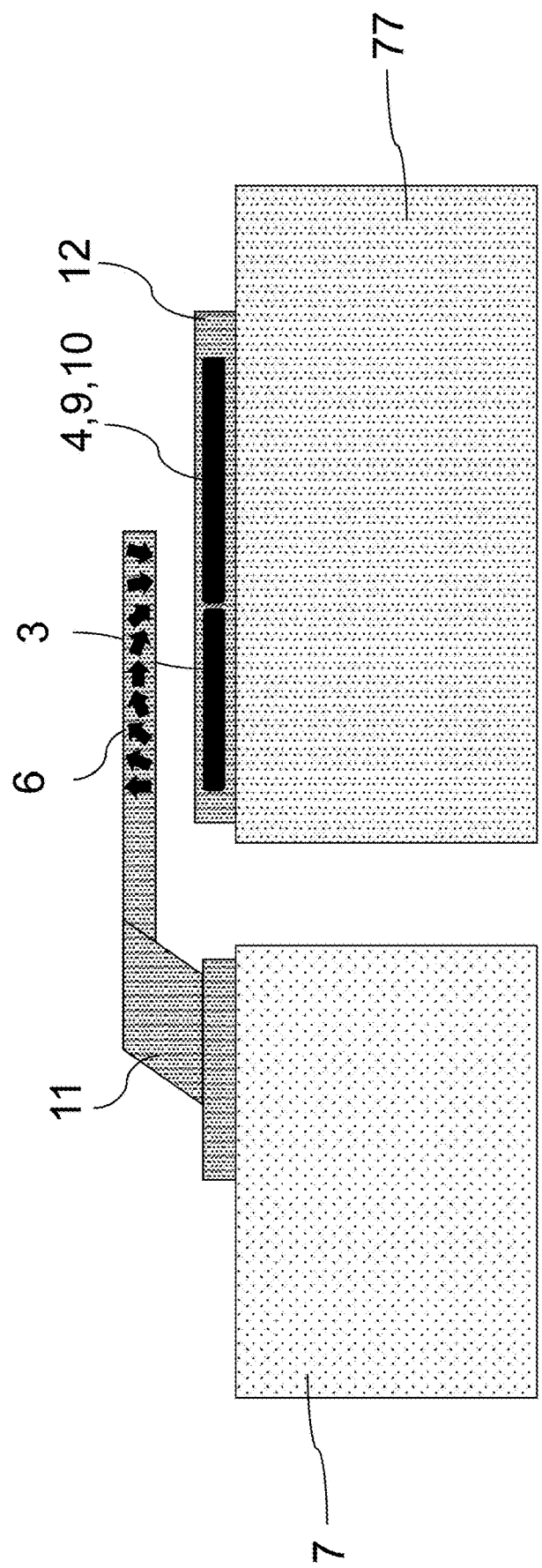

FIG. 6 shows a characteristic of the sensor described in FIG. 1. for measuring the distance and angular rotation between the reference body (77) and the body (7) to be measured, the permanent magnets having a magnetization which are magnetized according to a Halbach arrangement. This arrangement results in a maximum magnetic field on the side near the body (77) and a minimum field on the opposite side. Due to the large magnetic field, interference fields and magnetic noise of the sensors are minimized.

Other magnetic configurations of permanent magnets can consist of a pseudo random code (PRC) of the permanent magnet. A pseudo random code arranged along one track overlaps so that the first (N−1) bits of the current code are identical to the last (N−1) bits of the previous code. Any N bit long code, i.e. positions, can be determined by scanning the pseudo random code using a window containing N bits.

Figure 7:
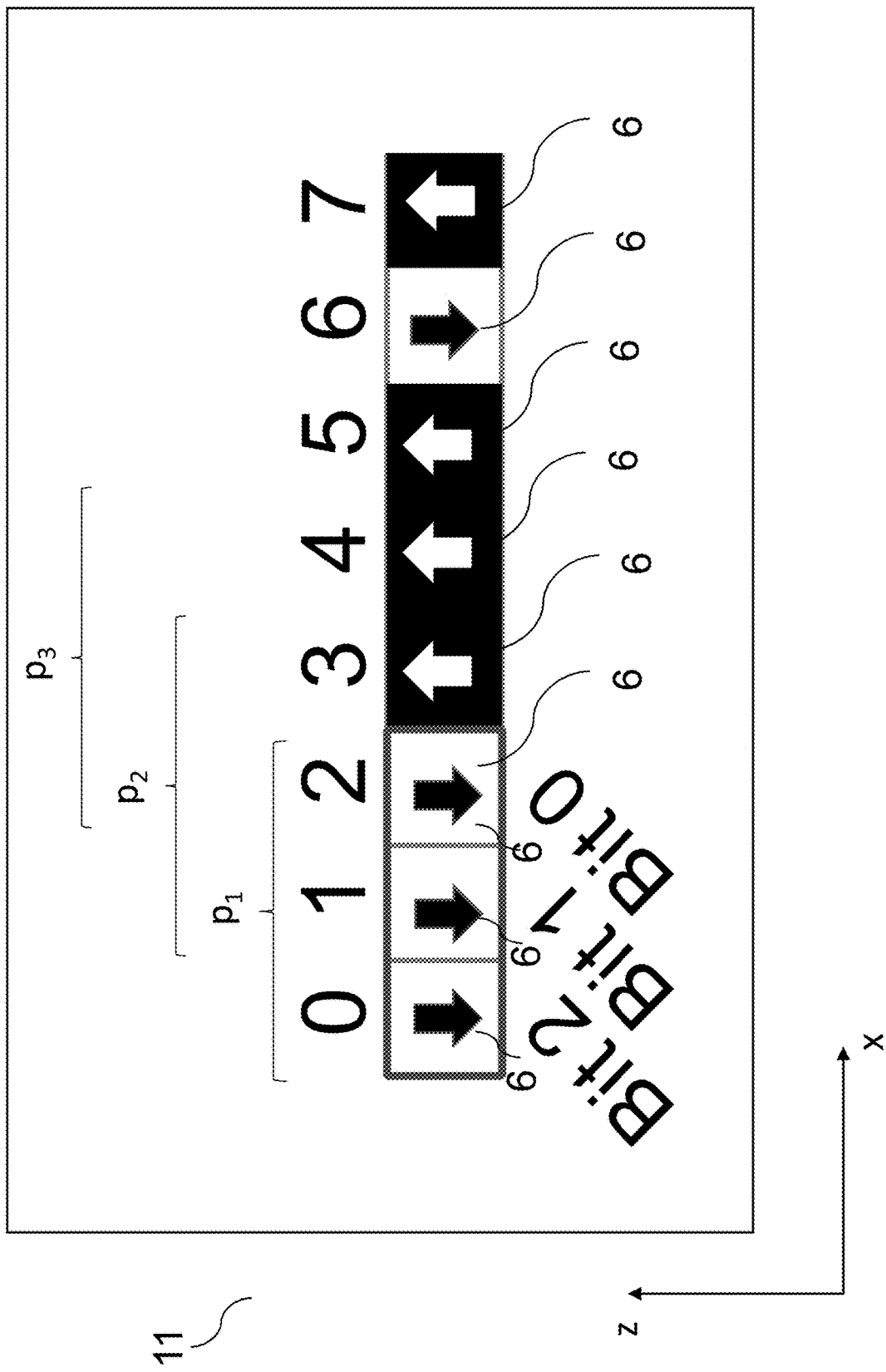

For example, the permanent magnets are arranged with the north pole up (z direction) or down (−z direction) according to a PRC, as shown in FIG. 7. Therefore, N bits, defined by the orientation of the permanent magnet, encode in an absolute way the position of this sequence of N bits. When the sequence is measured by the sensor array (3), the absolute position can be decoded.

Thus the coding is unique at each position $p_i$. If the magnetic field resulting from this encoding is read out with the magnetic field sensors (3), it is possible to deduce the position $p_i$, as well as through the previously described algorithms within the positions $p_i$ with even higher accuracy relative to the permanent magnets (6). In other words, in a first step the rough position can be determined on the basis of the unique bit pattern of the "pseudo random code" and in a second step a subbinary resolution can be achieved with the algorithm described above.

Figure 8:
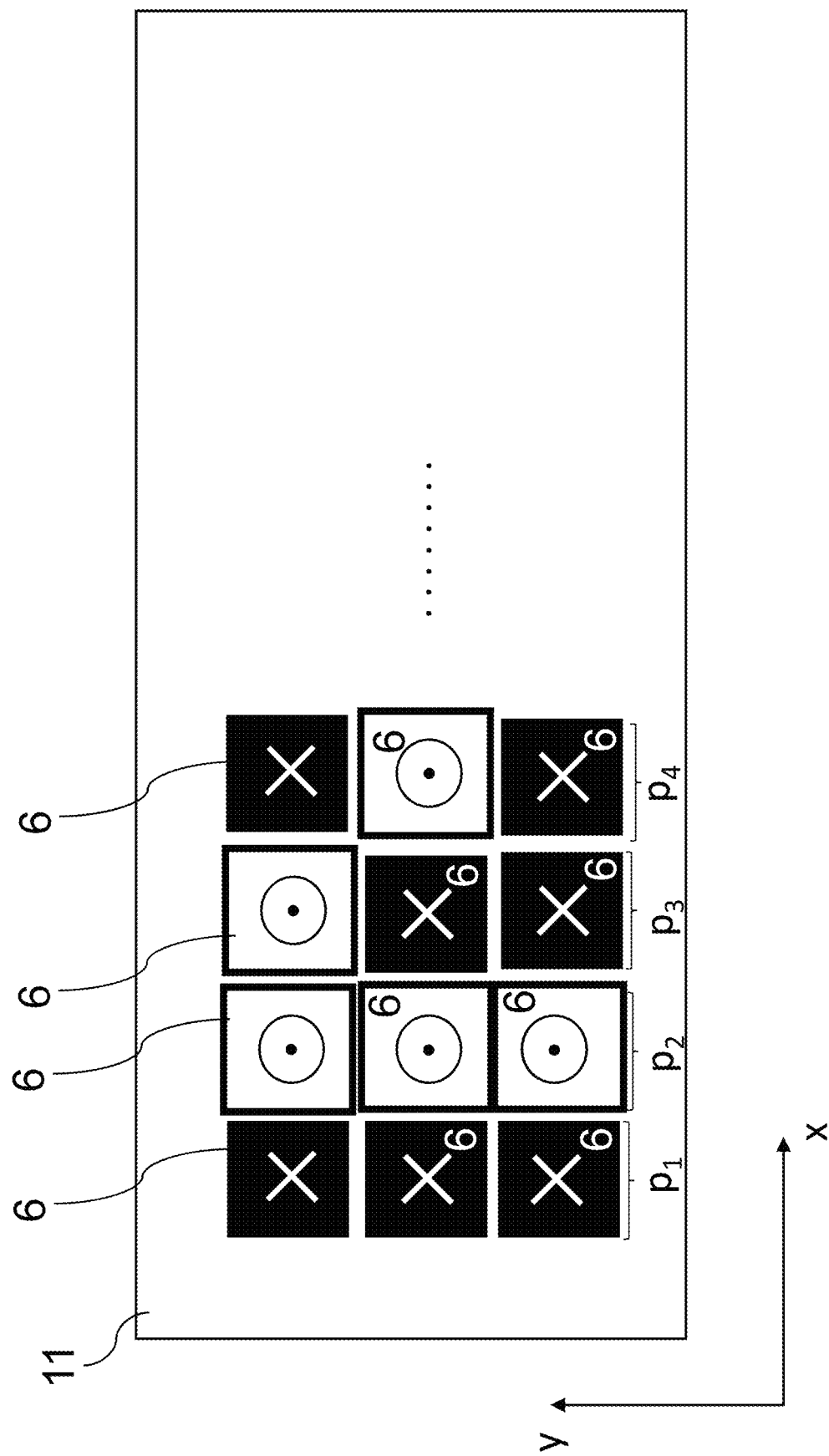
FIG. 8 a variant of the magnetization of the permanent magnets, where at each position $p_1$ a unique bit pattern exists in y-direction.

FIG. 8 shows a code where more than one track of permanent magnets is used. Here a unique bit pattern can be realized at each position pi.

Figure 9:
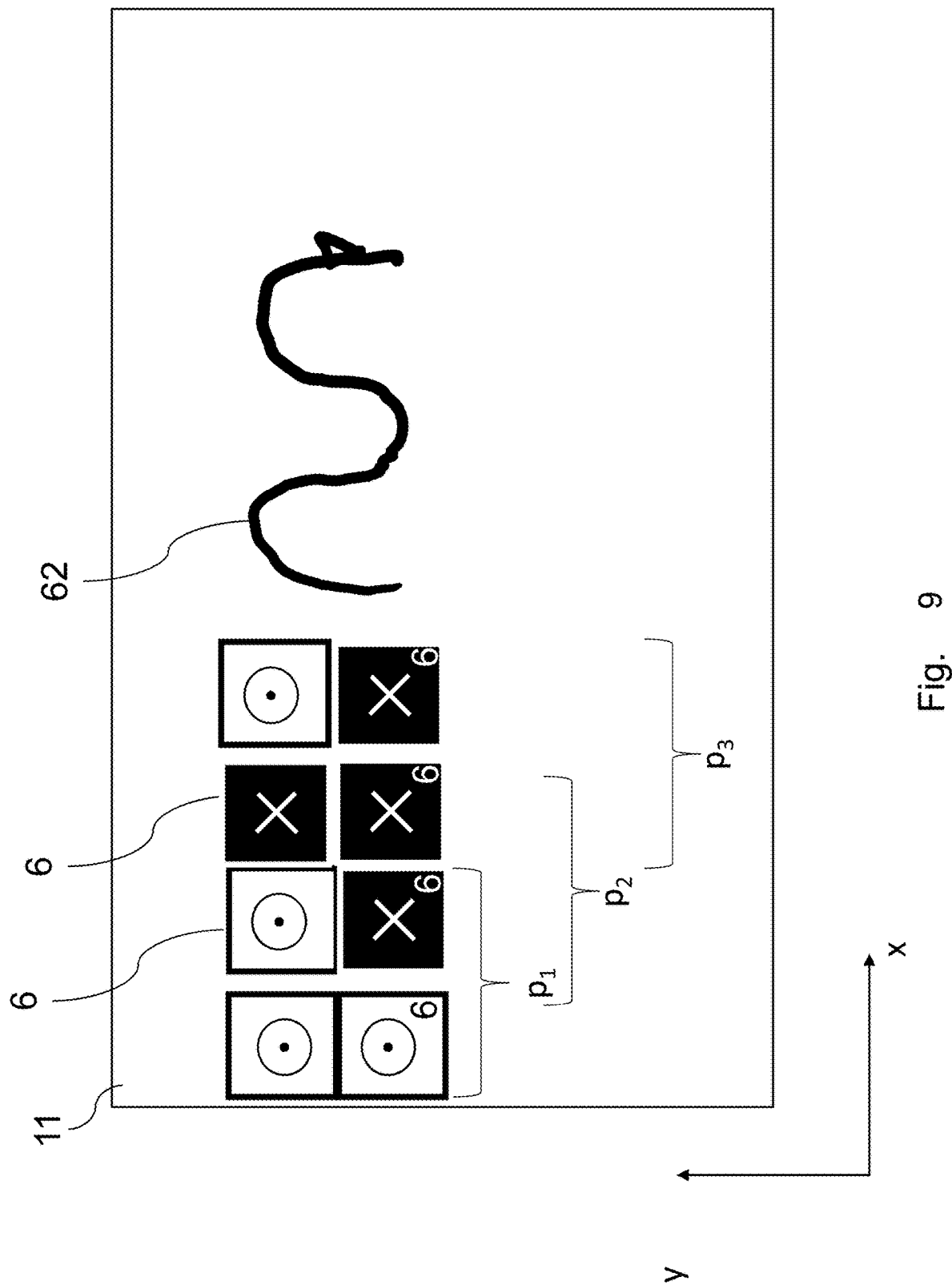
FIG. 9 a variant of the magnetization of the permanent magnets, where at each position $p_1$ a unique bit pattern exists in the x,y plane.

FIG. 9 shows a "Pseudo Random Code" which is not unwound along an axis but along a curve (62) in the x-y plane.

Figure 10:
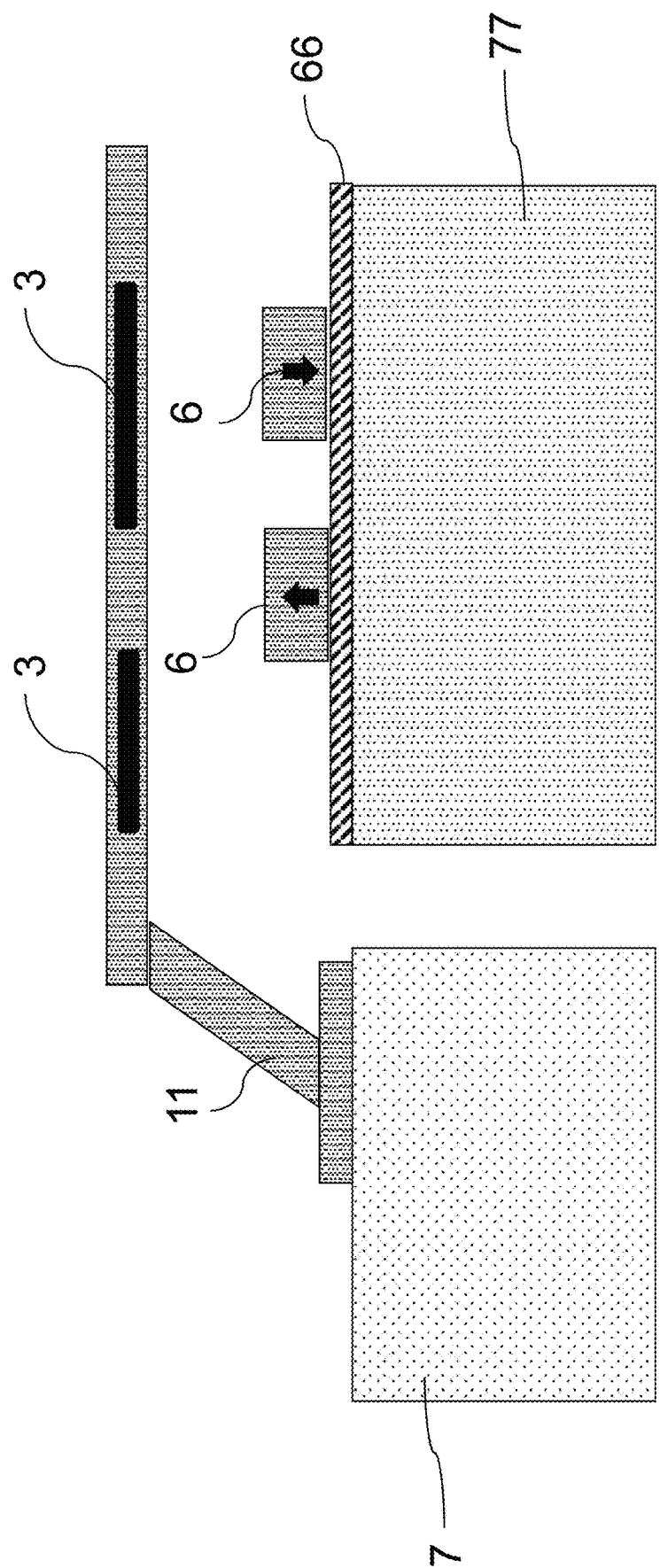
FIG. 10 a variant for measuring displacements between two bodies where the magnets are placed closer to the body (77) than the sensors and an optional soft magnetic element (66) (soft magnetic shield or soft magnetic ribbon) is placed under the magnets FIG. 11 a variant for measuring the mechanical pressure on the body (7)

FIG. 10 shows a characteristic of the sensor described in FIG. 1. for measuring the distance and the angular rotation between the reference body (77) and the body (7) to be measured, whereby, compared with FIG. 1, the positions of permanent magnets (6) and magnetic field sensors (3) are interchanged. The magnetic field sensors are near the reference body (77) and the magnetic field sensors (3) are at a further distance and fixed to the body (7). This arrangement is of particular advantage if the reference body (77) itself is a magnetic material, such as iron or steel. In the application this is an important case, if for example joints and connections of bridges made of steel or iron are to be measured. Due to the fixed position of the magnets (6) and the reference body (77), the magnetic field is not changed if the position of the body to be measured (7) changes. This is not the case with the arrangement as shown in FIG. 1. The influence of interfering magnetic fields of a magnetic reference body (77) can be reduced if a soft magnetic element (66) is placed between the permanent magnets. This magnetic shield can be made of iron, Mu—metal or any other soft magnetic material. The intrinsic magnetic susceptibility can be greater than 100.

Figure 11:
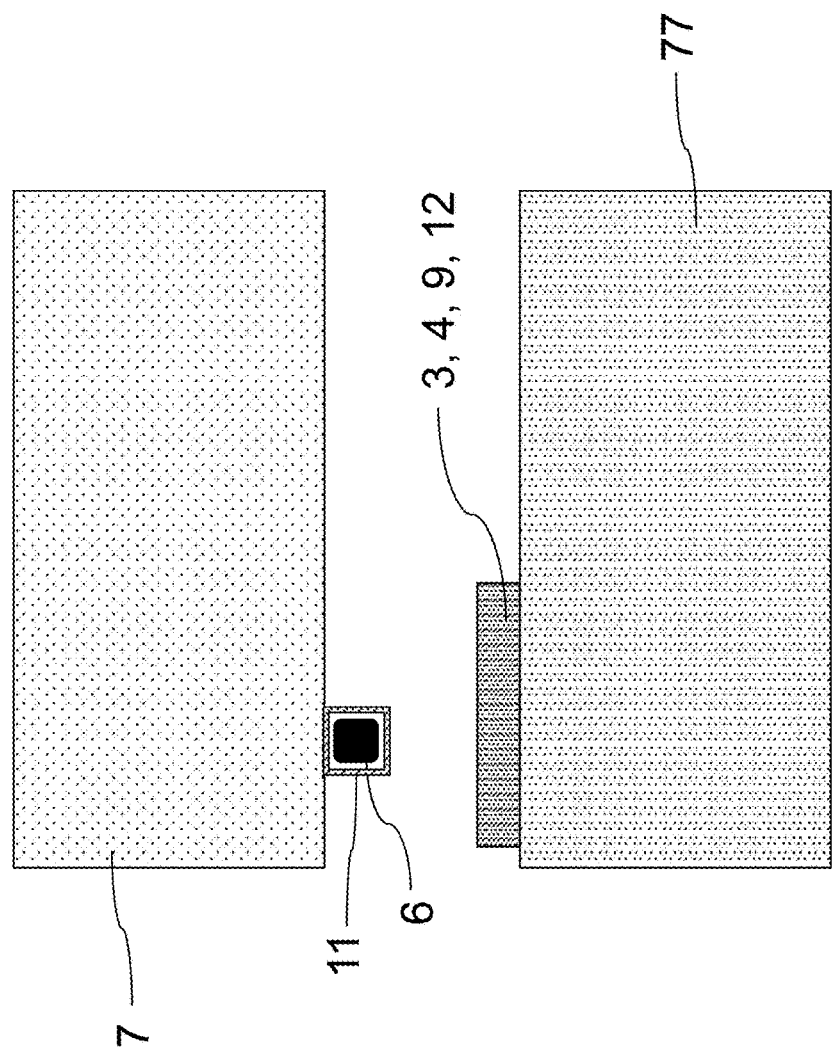

FIG. 11 shows a characteristic of the sensor described in FIG. 1. In this case the body to be measured is not a rigid object but a body which changes its mechanical form as a function of external influences such as temperature or pressure. An example is that the body (7) itself has a membrane which changes its shape as a function of pressure and thus leads to a change in the position of the magnet (6). This change in position can be determined by the magnetic sensors (3) based on the change in the magnetic field.

Figure 12:
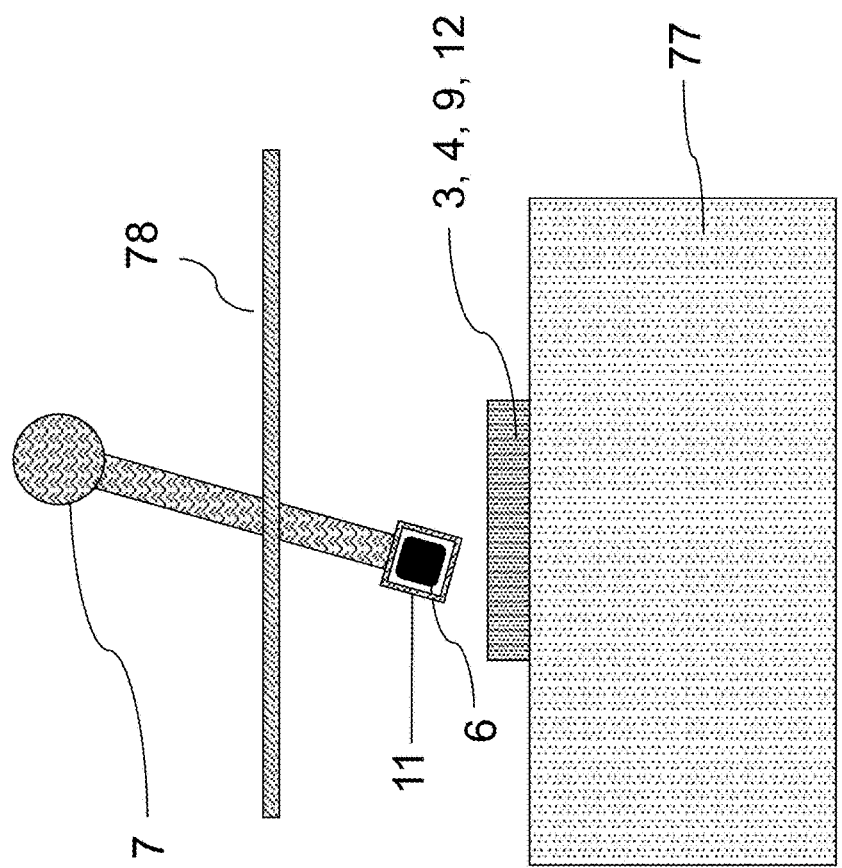
FIG. 12 a variant for determining the position and attitude of a joystick

FIG. 12 shows a system for measuring the distance and angular displacement between the reference body (77) and the body to be measured (7). This characteristic represents the body (7) to be measured as an elongated cylinder which penetrates a plane (78). An example is the detection of positions of a switch or the continuous detection of the movement of a lever.

Figure 13:
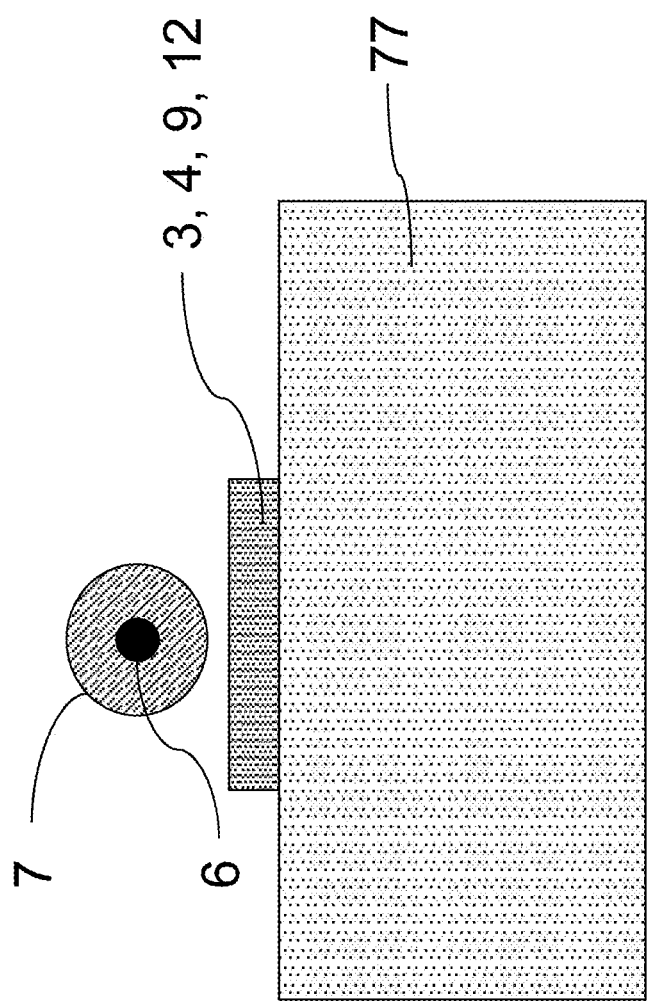
FIG. 13 a variant for determining the deviation of a mounted shaft

FIG. 13 shows a system for measuring the distance, angular displacement and rotational speed between the reference body (77) and the body to be measured (7). The body (7) to be measured rotates along an axis.

Figure 14:
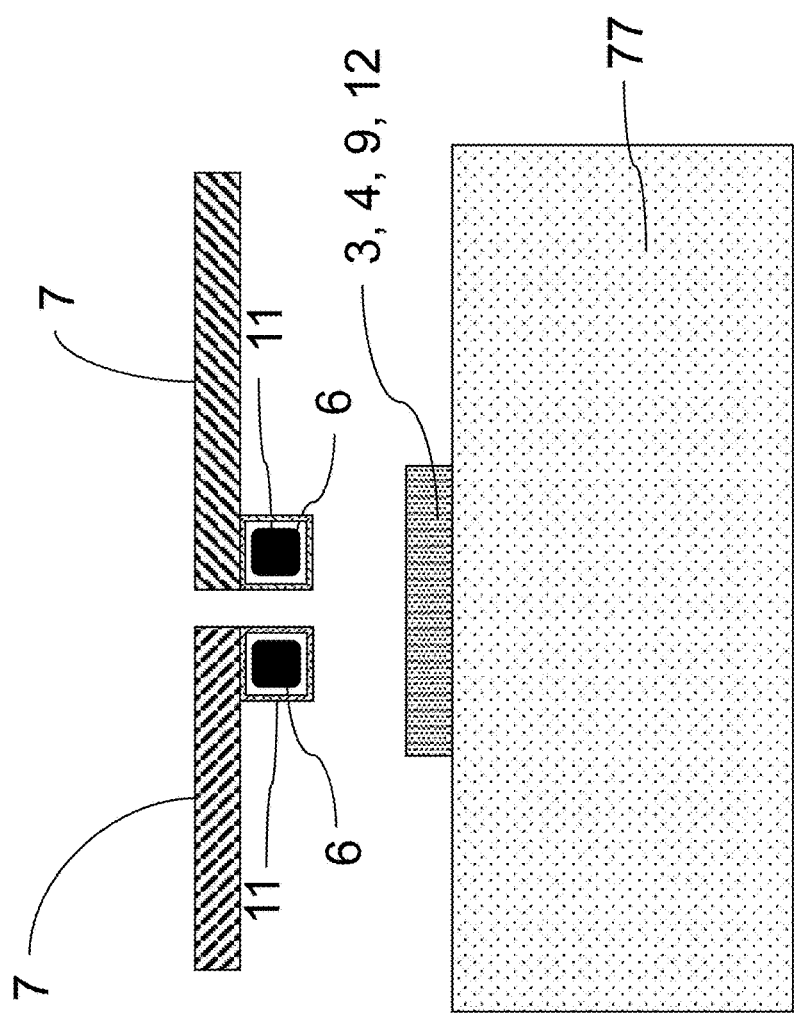
FIG. 14 a variant for measuring displacements between three bodies

FIG. 14 shows a system for measuring the distance and angular displacement between the reference body (77) and several bodies (7) to be measured. Each body (7) to be measured is equipped with a permanent magnet (6).

Figure 15:
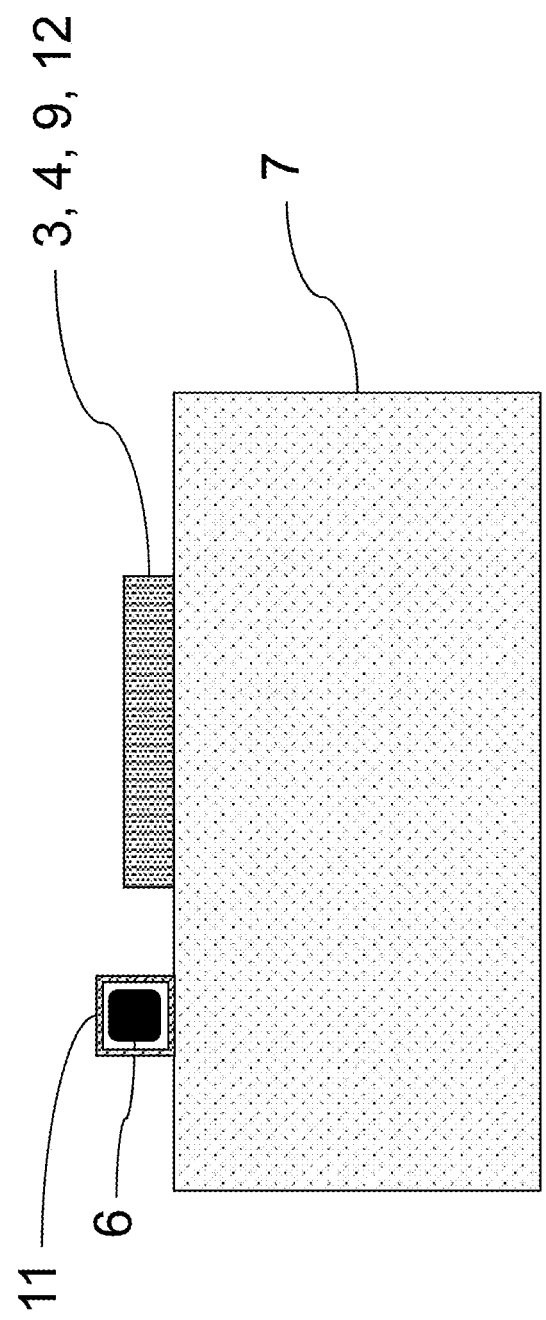
FIG. 15 a variant for measuring the strains of a body

FIG. 15 shows a system where the permanent system and the sensors (3) are mounted on the same body. Thus a change in length of the body (7) to be measured can be detected.

These changes describe elongation of the material of which the body is made, which is caused by stress, temperature or aging.

Instead of a permanent magnet (2), for example, electromagnets can also be used.

The respective actual arrangement of the various magnetic field sensors (3) and permanent magnet system (6) may differ from those shown. For example, the permanent magnet system (6), magnetic field sensor (3), microchip (4) and antenna (9) can be interchanged. The casing (11, 12) in which the permanent magnet (6) or other components (3, 4, 6, 9, 10) are embedded can be made of a wide variety of materials. Plastics such as thermoplastics, duroplastics, elastomers are particularly preferred. For high temperature applications, refractory ceramics such as compounds of silicate raw materials, compounds based on magnesite, SiOxides-, aluminium oxide, silicon carbide, boron nitride, zirconium oxide, silicon nitride, aluminium nitride, tungsten carbide and aluminium titanate can-be used.

As magnetic field sensors Hall sensors, AMR, sensors, GMR sensors and TMR sensors, magnetoimpetance sensors or squid sensors can be used. For TMR and GMR sensors, sensors that show a vortex state in the free magnetic layer are particularly suitable (US20150185297A1).

Magnetic materials for the permanent magnets can be sintered magnets, polymer-bound magnets or magnets produced by additive manufacturing (Huber, C., et al. Applied Physics Letters 109.16 (2016): 162401). Examples of hard magnetic materials are rare earth magnets (NdFeB,SmFeB), magnetic ferrites (Sr—Fe,Ba—Fe), Alnico magnets.

Figure 16:
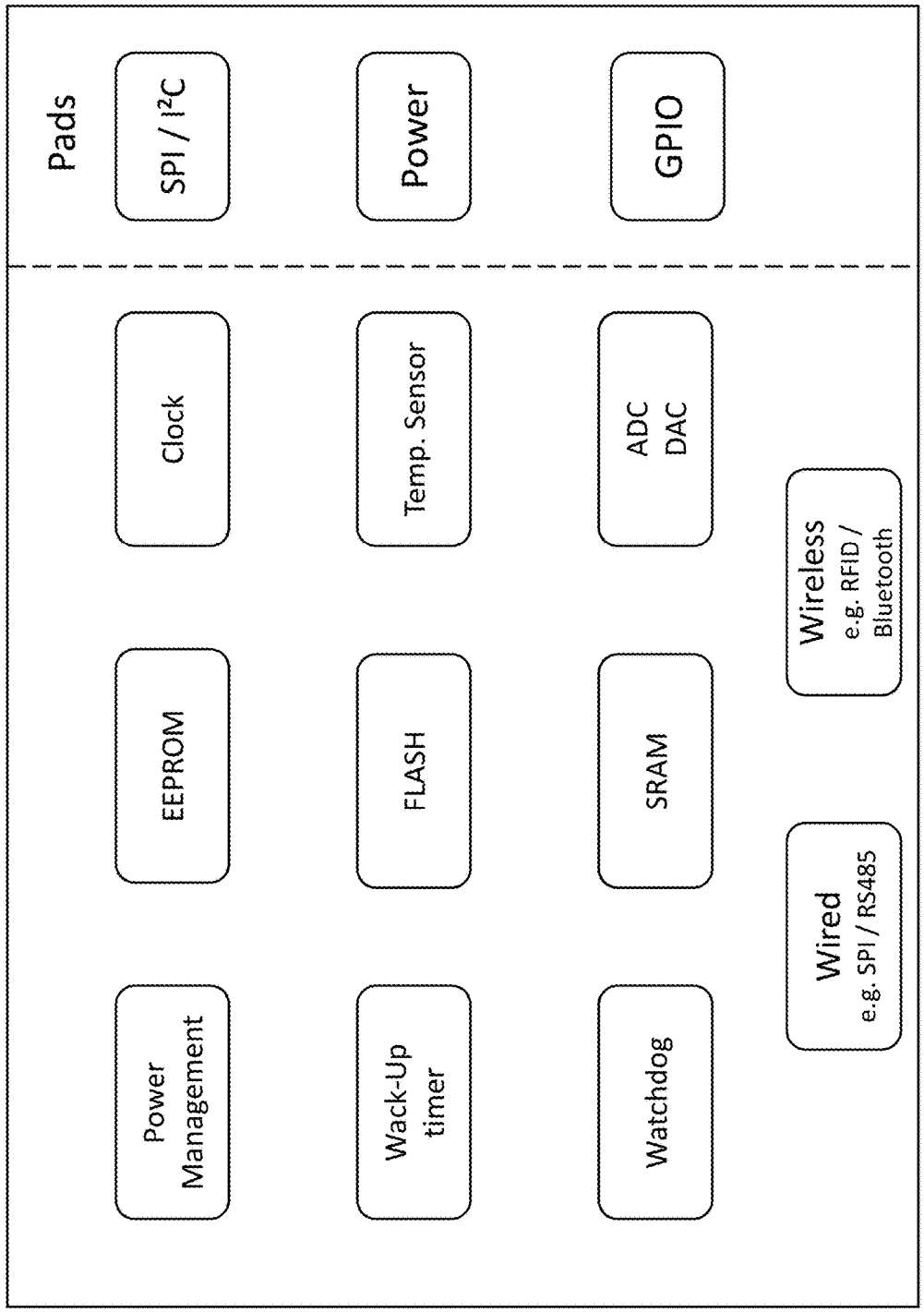
FIG. 16 possible components of a microchip

FIG. 16 shows the typical components of the microchip including wired communication and wireless communication. This includes optional memory, such as EEPROM (electrically erasable programmable read-only memory), optional battery, antenna, electronic product code (EPC), optional temperature sensor, multiplexer and optional real time clock (RTC). The transmission frequency for wireless communication can be ISM (2.4 Ghz), UHF (0.3 to 3 GHz), HF (3 to 30 MHz), or any other common operating frequency. Preferred RF carrier frequencies are between 12 MHz-14 MHz (NFC) and 860-970 MHz (UHF).

Figure 17:
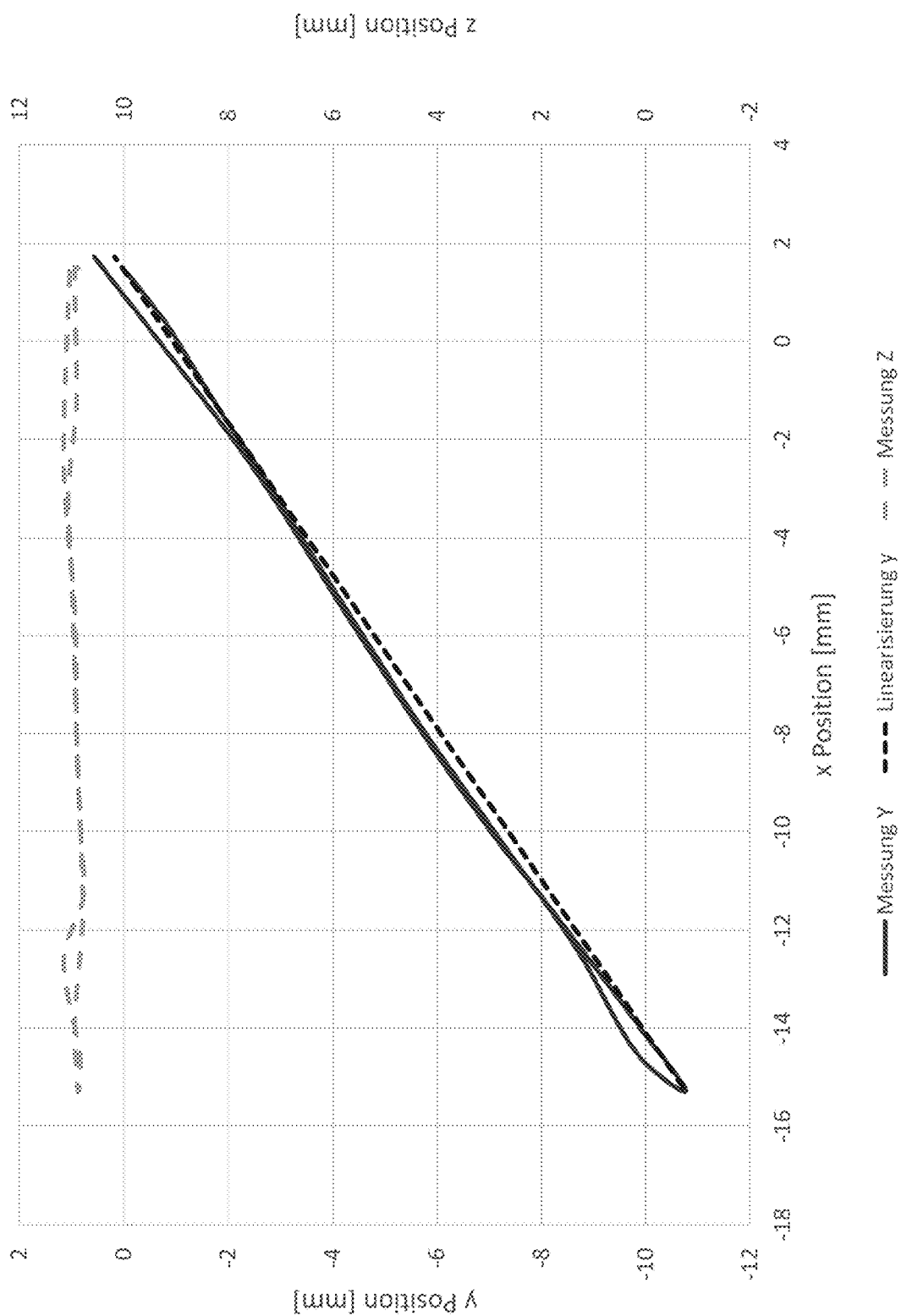
FIG. 17 shows the comparison between the measured position of the permanent magnet and the specified linear behaviour

FIG. 17 shows a graph showing the dependence of the measured position of the sensor. In this case the body to be measured was moved along a straight line.

Figure 18:
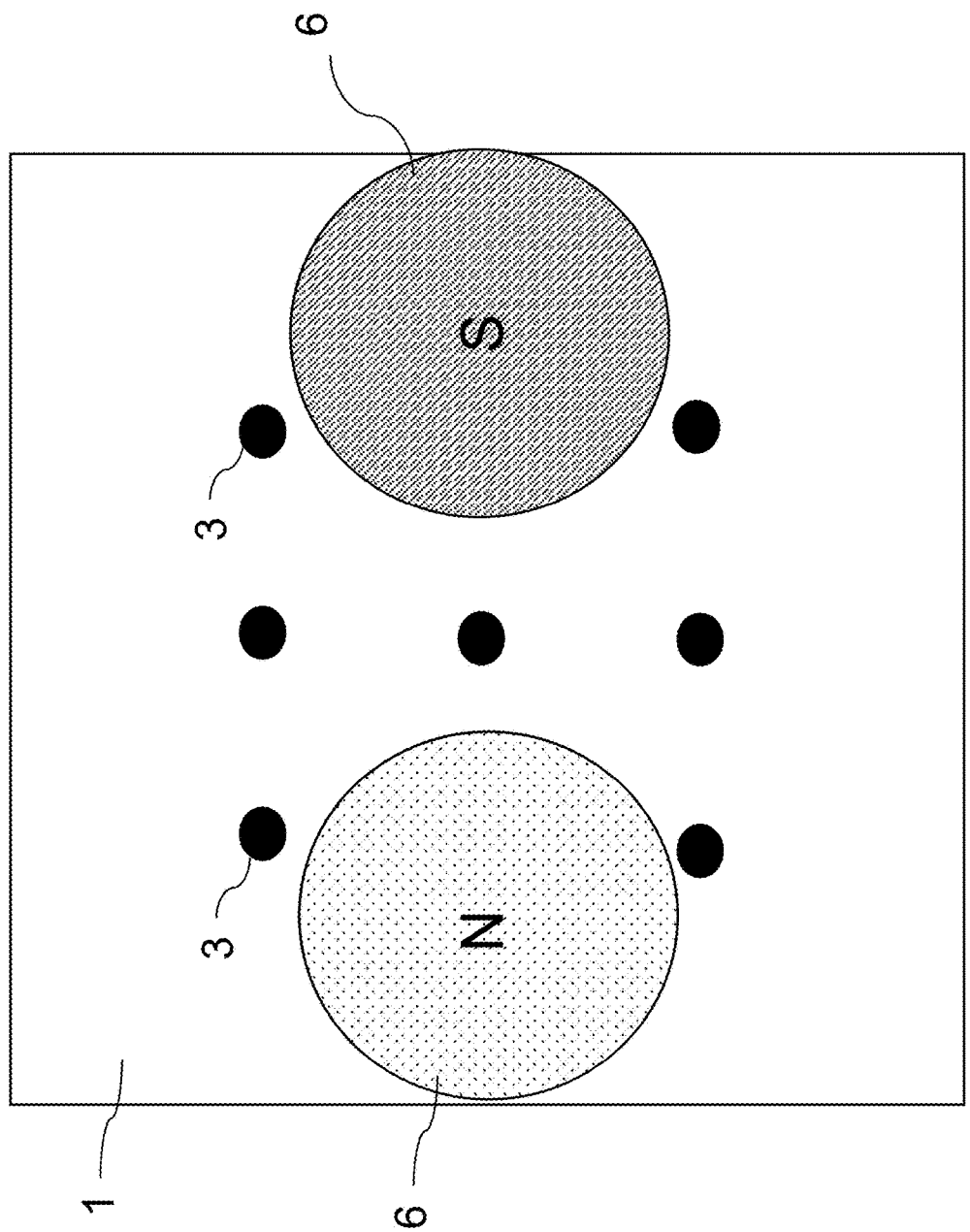
FIG. 18 shows the arrangement of magnets and sensors of another concrete example

FIG. 18 shows a possible geometrical arrangement of the sensors. Here the distance of the outermost sensors is 30 mm. The sensor array (3) consists of (3×3 sensors) Two magnets with opposite magnetisation are used. The magnets have a dimension of radius=4 mm, height=10 mm and the saturation polarization is Js=1 T. The lateral distance of the magnets (edge to edge) is 5 mm. The distance of the surface of the magnets to the surface of the sensors is 3 mm. The sensor noise $B_{noise}$ (rms) is $B_{noise}$=1 mT.

Figure 19:
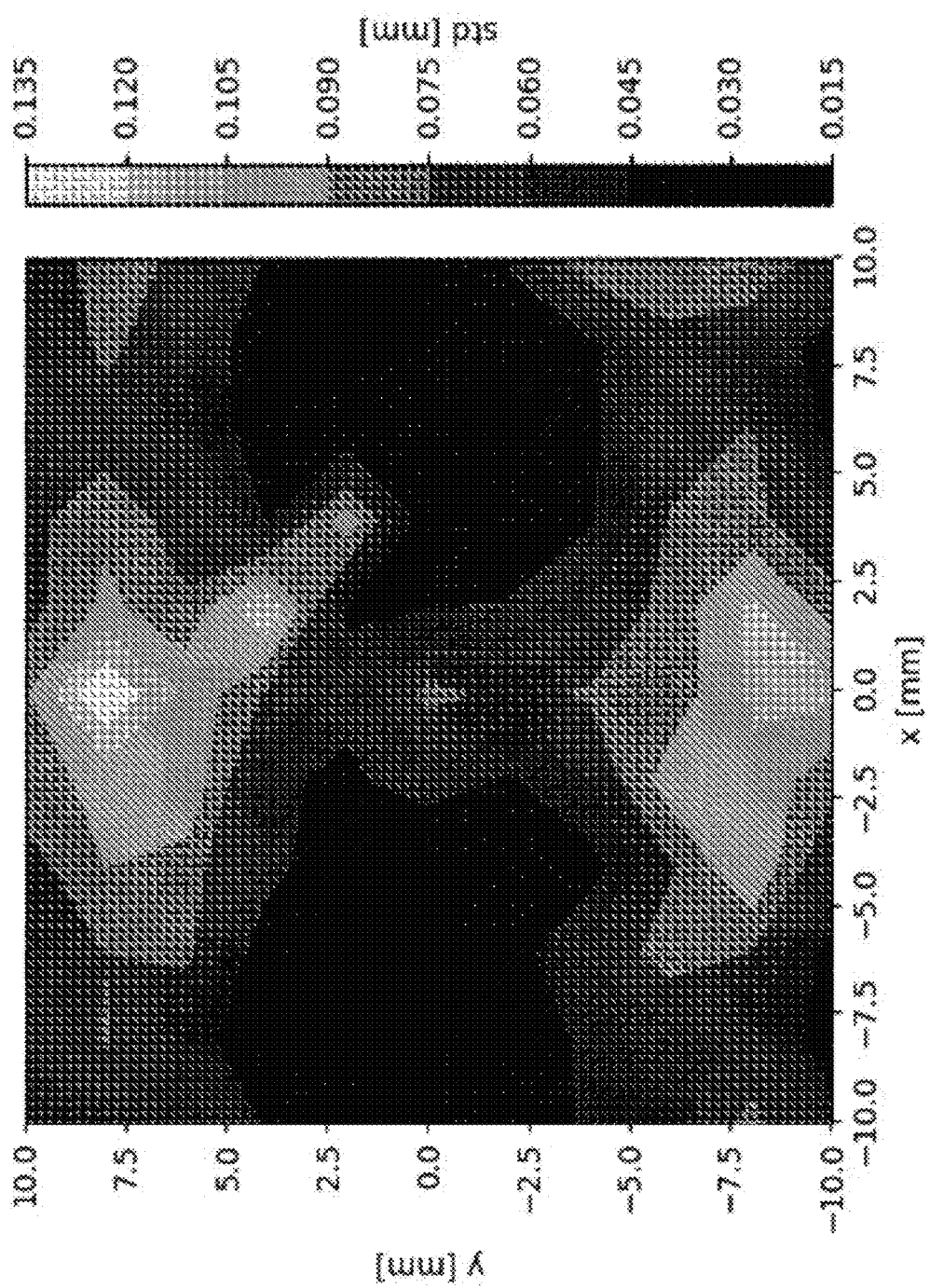
FIG. 19 shows the standard deviation of the x-position of the displacement

In FIG. 19 the standard deviation of the determined x-position is determined for different positions of the body to be measured (7). The body to be measured was placed in a range of 20 mm in x-direction and y-direction. The maximum inaccuracy is about 0.6% of the measuring range.

Possible geometries and arrangements of the magnets and sensors are for example those where the smallest lateral extension of at least one permanent magnet is greater than 0.2 times the average distance of the sensors (3) and the distance between the centres of the magnets is greater than 0.2 times the average distance of the sensors. Due to the high field gradients, such arrangements lead to an accurate determination of the alignment in space.

Figure 20:
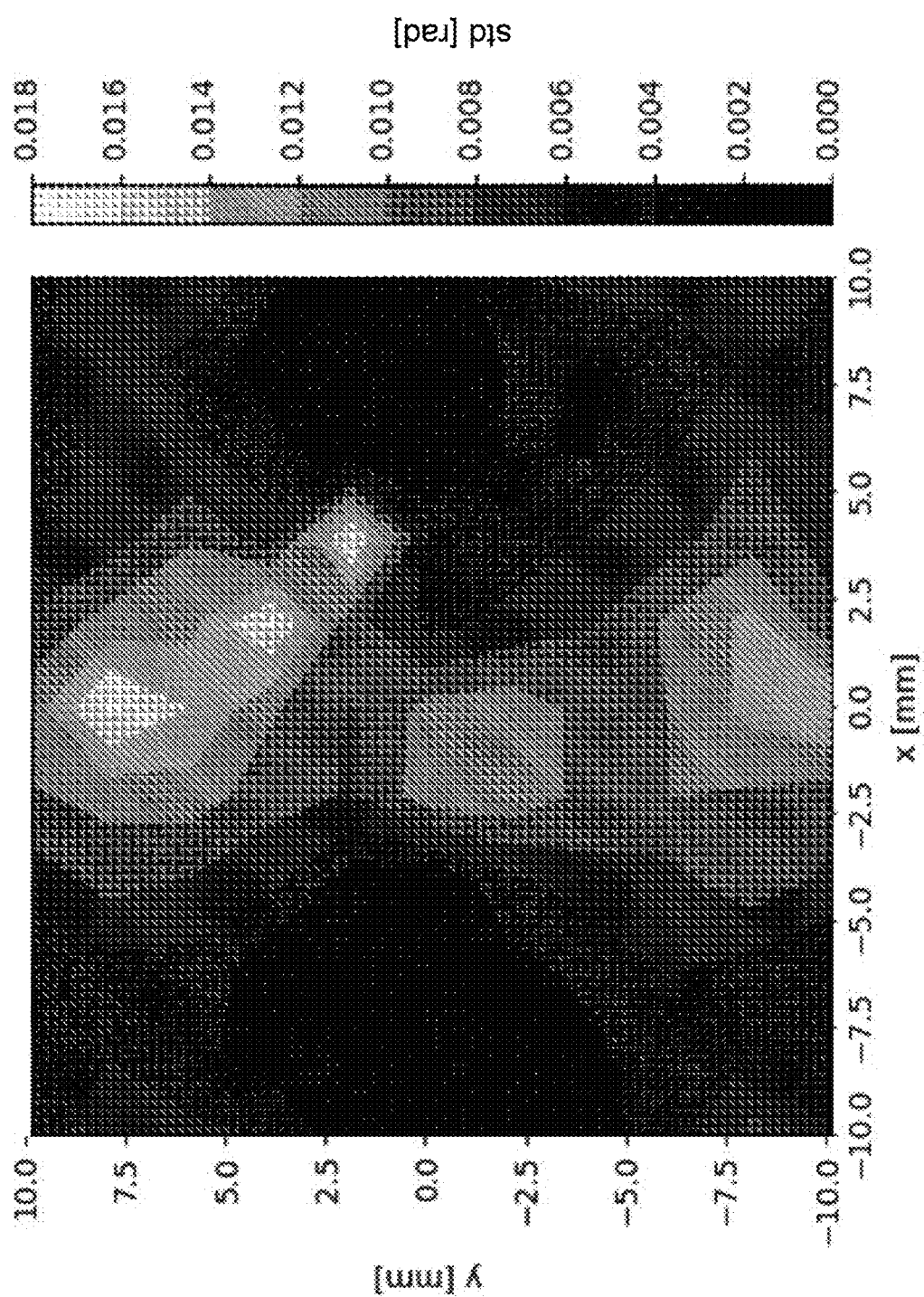
FIG. 20 shows the standard deviation of the angle

In FIG. 20 the standard deviation of the rotation angle around the z-axis is determined for different positions of the body to be measured (7). The body to be measured was placed in a range of 20 mm in x-direction and y-direction. The maximum inaccuracy of the rotation angle is 0.018 rad, which corresponds to approx. 1°.

Different combinations of the elements shown and described are also possible and, of course, in the future new materials with the above-mentioned properties can be used, even if their names do not correspond to those currently used. The reason for this explicit statement is that especially the material sciences are in rapid development and no restriction of protection should be derived from this.

The invention claimed is:

1. A method for measuring an alignment between two bodies comprising at least two magnetic field sensors mounted on one body and at least one permanent magnet mounted on another body, the method comprising:
   generating, by the at least one permanent magnet, a magnetic field $H_{measurement}$ at positions $x_i$ of the at least two sensors;
   measuring, by the at least wo sensors, at least one component of the generated magnetic field $H_{measurement}$;
   calculating a magnetic theoretical field $H_{theory}$, the magnetic theoretical field $H_{theory}$ generated by the at least one permanent magnet at the positions $x_i$ for a given position and a given alignment $y_{magnet}$ of the at least one permanent magnet,
   determining a difference d between the magnetic theoretical field and the measured magnetic field $H_{measurement}$ such that $d(y_{magnet})=H_{theory}(y_{magnet})-H_{measurement}$; and
   determining a position and alignment $y_{magnet}$ of the at least one permanent magnet in such a way that a mathematical norm of the difference d is minimized and thus the position and alignment $y_{magnet}$ of the at least one permanent magnet relative to the field sensors is determined.

2. The method according to claim 1, wherein the starting value of the alignment of the magnet system $y_{magnet,0}$ is associated with the at least two magnetic field sensors mounted on one body, a housing comprising at least one permanent magnet mounted on another body, the permanent magnets at the positions of the at least two magnetic field sensors generating a magnetic field $H_{measurement}$ at least one component of the magnetic field of the at least two sensors is measured, wherein the orientation of the at least one permanent magnet $y_{magnet}$ is determined by first training a machine learning method where for a plurality of alignments $y_{magnet}$ of the at least one permanent magnet the expected magnetic field $H_{theory}(y_{magnet})$ is determined at the locations of the at least two sensors and used as training data for the machine learning method, thereby enabling the machine learning method to predict for a certain measured field $H_{measurement}$ approximation of $y_{magnet}$.

3. The method according to claim 1, wherein the alignment of the at least one permanent magnet $y_{magnet}$ only includes local displacements in space, thereby $y_{magnet}=x_{magnet}$, where $x_{magnet}$ comprises an unknown position of the at least one magnet.

4. The method according to claim 1, wherein the distance between two bodies is determined from alignments $y_{magnet}$ of the at least one permanent magnet $y_{magnet}$.

5. The method according to claim 1, wherein a soft magnetic shield is mounted between the at least one permanent magnet and the body.

6. The method according to claim 1, wherein the magnetic theoretical field $H_{theory}$ field is scaled with a factor and the factor is determined in minimizing the distance d.

7. The method according to claim 1, wherein at least one permanent magnet comprises a non-parallel magnetization with respect to one of the other permanent magnets.

8. The method according to claim 1, wherein the at least one permanent magnet is magnetized as a pseudo-random code.

9. The method according to claim 1, wherein the theoretical field $H_{theory}(y_{magnet})$ at the locations of the at least two sensors are determined by an analytical or numerical calculation of the magnetic field.

10. A method for measuring an alignment $y_{magnet}$ between two bodies comprising at least two magnetic field sensors mounted on one body and a housing comprising at least one permanent magnet mounted on another body, the method comprising:
   generating, the at least one permanent magnet at positions of the at least two magnetic field sensors, a magnetic field $H_{measurement}$;
   measuring at least one component of the magnetic field of the at least two sensors, wherein an orientation of the at least one permanent magnet $y_{magnet}$ is determined by a first training machine learning method, wherein for a plurality of alignments $y_{magnet}$ of the at least one permanent magnet the expected magnetic field $H_{theory}(y_{magnet})$ is determined at the locations of the at least two sensors and used as training data for the machine learning method, thereby enabling the machine learning method to predict for a certain measured field $H_{measurement}$ an approximation of $y_{magnet}$.

11. The method according to claim 10, wherein a soft magnetic shield is mounted between the at least one permanent magnet and the body.

12. The method according to claim 10, wherein the at least one permanent magnet is magnetized as a pseudo-random code.

13. The method according to claim 10, wherein the machine learning method uses at least one of neural networks, gradient boost, or regression.

14. The method according to claim 10, wherein, for a plurality of alignments $y_{magnet}$, the machine learning method is training with the expected magnetic field $H_{theory}(y_{magnet})$ determined by physically changing orientation of the magnetic field system (relative to the at least two sensors and values $H_{theory}(y_{magnet})$ are determined by reading out the magnetic field sensors.

15. The method according to claim 10, wherein the alignment of the at least one permanent magnet $y_{magnet,0}$ is determined using the trained machine learning method, the determined alignment $y_{magnet,0}$ being used as a starting value for $y_{magnet}$, $y_{magnet}$ being refined using the method for measuring the alignment between two bodies.

\* \* \* \* \*